(12) United States Patent
Zhang et al.

(10) Patent No.: US 11,970,777 B2
(45) Date of Patent: *Apr. 30, 2024

(54) DEPOSITION OF LOW-K FILMS

(71) Applicant: Applied Materials, Inc., Santa Clara, CA (US)

(72) Inventors: Shuaidi Zhang, San Jose, CA (US); Ning Li, San Jose, CA (US); Mihaela A. Balseanu, Sunnyvale, CA (US); Bhaskar Jyoti Bhuyan, San Jose, CA (US); Mark Saly, Santa Clara, CA (US); Thomas Knisley, Livonia, MI (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/848,600

(22) Filed: Jun. 24, 2022

(65) Prior Publication Data

US 2022/0325412 A1 Oct. 13, 2022

Related U.S. Application Data

(63) Continuation of application No. 16/950,096, filed on Nov. 17, 2020, now Pat. No. 11,447,865.

(51) Int. Cl.
*C23C 16/32* (2006.01)
*C01B 21/082* (2006.01)
(Continued)

(52) U.S. Cl.
CPC .... *C23C 16/45553* (2013.01); *C01B 21/0828* (2013.01); *C01B 32/907* (2017.08);
(Continued)

(58) Field of Classification Search
CPC .. C23C 16/32; C23C 16/455; C23C 16/45554
See application file for complete search history.

(56) References Cited

U.S. PATENT DOCUMENTS 5,074,017 A 12/1991 Toya et al.
5,186,718 A 2/1993 Tepman et al.
(Continued)

FOREIGN PATENT DOCUMENTS

CN 108987300 A * 12/2018 ............. H01L 21/67
EP 2669249 B1 12/2013
(Continued)

OTHER PUBLICATIONS

Lee, Jaemin, et al., "Characteristics of low-κ SiOC films deposited via atomic layer deposition". Thin Solid Films 645 (2018) pp. 334-339.*

(Continued)

*Primary Examiner* — Bret P Chen
(74) *Attorney, Agent, or Firm* — Servilla Whitney LLC

(57) ABSTRACT

Methods for atomic layer deposition (ALD) or plasma enhanced atomic layer deposition (PEALD) of low-K films are described. A method of depositing a film comprises exposing a substrate to a silicon precursor having the general formulae (Ia), (Ib), (Ic), (Id), (IX), or (X); and exposing the substrate to an oxidant to react with the silicon-containing film to form one or more of a silicon oxycarbide (SiOC) film or a silicon oxycarbonitride (SiOCN) film on the substrate, the oxidant comprising one or more of a carboxylic acid, an aldehyde, a ketone, an ethenediol, an oxalic acid, a glyoxylic acid, a peroxide, an alcohol, and a glyoxal.

20 Claims, 2 Drawing Sheets

(51) Int. Cl.
    *C01B 32/907* (2017.01)
    *C23C 16/30* (2006.01)
    *C23C 16/34* (2006.01)
    *C23C 16/36* (2006.01)
    *C23C 16/455* (2006.01)

(52) U.S. Cl.
    CPC .......... *C23C 16/308* (2013.01); *C23C 16/325* (2013.01); *C23C 16/345* (2013.01); *C23C 16/36* (2013.01); *C23C 16/45536* (2013.01)

(56) References Cited

U.S. PATENT DOCUMENTS

| | | |
|---|---|---|
| 5,580,388 A | 12/1996 | Moore |
| 6,634,314 B2 | 10/2003 | Hwang et al. |
| 6,818,250 B2 | 11/2004 | George et al. |
| 7,244,683 B2 | 7/2007 | Chung et al. |
| 7,897,208 B2 | 3/2011 | Mahajani et al. |
| 8,048,484 B2 | 11/2011 | Rahtu |
| 8,329,599 B2 | 12/2012 | Fukazawa et al. |
| 8,562,746 B2 | 10/2013 | Gurary et al. |
| 9,637,822 B2 | 5/2017 | Bergmann et al. |
| 9,692,009 B2 | 6/2017 | Lang et al. |
| 10,023,958 B2 | 7/2018 | Nguyen et al. |
| 10,134,583 B2 | 11/2018 | Hwang et al. |
| 10,134,617 B2 | 11/2018 | Gurary et al. |
| 11,447,865 B2 * | 9/2022 | Zhang ..................... C23C 16/36 |
| 2001/0049203 A1 | 12/2001 | Kim et al. |
| 2004/0004859 A1 | 1/2004 | Forbes et al. |
| 2005/0025885 A1 | 2/2005 | McSwiney et al. |
| 2005/0163927 A1 | 7/2005 | McSwiney et al. |
| 2006/0102081 A1 | 5/2006 | Jeno et al. |
| 2007/0123060 A1 | 5/2007 | Rahtu |
| 2007/0218702 A1 | 9/2007 | Shimizu et al. |
| 2008/0160174 A1 | 7/2008 | Wang et al. |
| 2009/0137132 A1 | 5/2009 | Bhatia et al. |
| 2010/0068894 A1 | 3/2010 | Wang et al. |
| 2010/0124618 A1 | 5/2010 | Kobayashi et al. |
| 2010/0304047 A1 | 12/2010 | Yang et al. |
| 2011/0195582 A1 | 8/2011 | Zhou |
| 2012/0009802 A1 | 1/2012 | Lavoie et al. |
| 2012/0122302 A1 * | 5/2012 | Weidman .......... H01L 21/02274 118/723 R |
| 2012/0214318 A1 | 8/2012 | Fukazawa et al. |
| 2013/0071580 A1 | 3/2013 | Weidman |
| 2013/0078376 A1 | 3/2013 | Higashino et al. |
| 2013/0098477 A1 | 4/2013 | Yudovsky et al. |
| 2013/0115763 A1 | 5/2013 | Takamure et al. |
| 2013/0118407 A1 | 5/2013 | Park et al. |
| 2013/0129940 A1 | 5/2013 | Xiao et al. |
| 2013/0210241 A1 * | 8/2013 | LaVoie .............. H01L 21/76898 257/E21.24 |
| 2013/0244446 A1 | 9/2013 | Tsuji et al. |
| 2014/0141674 A1 | 5/2014 | Galbreath et al. |
| 2014/0273528 A1 | 9/2014 | Niskanen et al. |
| 2014/0287596 A1 | 9/2014 | Hirose et al. |
| 2014/0356549 A1 | 12/2014 | Varadarajan |
| 2015/0147484 A1 | 5/2015 | Nguyen et al. |
| 2015/0162185 A1 | 6/2015 | Pore |
| 2015/0376211 A1 * | 12/2015 | Girard ................. H01L 21/0228 556/412 |
| 2015/0376786 A1 | 12/2015 | Yudovsky et al. |
| 2016/0111272 A1 | 4/2016 | Girard et al. |
| 2016/0111288 A1 | 4/2016 | Antonelli et al. |
| 2016/0281227 A1 | 9/2016 | Kobayashi et al. |
| 2016/0284542 A1 * | 9/2016 | Noda .................. H01J 37/3244 |
| 2016/0293398 A1 | 10/2016 | Danek et al. |
| 2016/0336178 A1 | 11/2016 | Swaminathan et al. |
| 2017/0084714 A1 | 3/2017 | Ching et al. |
| 2017/0140924 A1 | 5/2017 | Suzuki et al. |
| 2017/0140925 A1 * | 5/2017 | Suzuki .............. H01L 21/02216 |
| 2017/0190720 A1 | 7/2017 | Fafard et al. |
| 2017/0323782 A1 * | 11/2017 | Suzuki .............. C23C 16/45536 |
| 2018/0065995 A1 | 3/2018 | Hopkins et al. |
| 2018/0096842 A1 | 4/2018 | Varadarajan et al. |
| 2018/0138405 A1 | 5/2018 | McKerrow et al. |
| 2018/0158833 A1 | 6/2018 | Richter et al. |
| 2018/0197733 A1 | 7/2018 | Suzuki et al. |
| 2018/0269058 A1 | 9/2018 | Smith et al. |
| 2018/0269061 A1 | 9/2018 | Arghavani et al. |
| 2018/0286676 A1 * | 10/2018 | Tak .................. H01L 21/02656 |
| 2018/0291505 A1 | 10/2018 | Nguyen et al. |
| 2018/0294152 A1 | 10/2018 | Xiao et al. |
| 2018/0315597 A1 | 11/2018 | Varadarajan et al. |
| 2018/0315598 A1 | 11/2018 | Li et al. |
| 2018/0347035 A1 | 12/2018 | Weimer et al. |
| 2018/0350587 A1 | 12/2018 | Jia et al. |
| 2018/0371612 A1 | 12/2018 | Yoo et al. |
| 2019/0057858 A1 | 2/2019 | Hausmann et al. |
| 2019/0074172 A1 | 3/2019 | Susa et al. |
| 2019/0080903 A1 | 3/2019 | Abel et al. |
| 2019/0085451 A1 | 3/2019 | Lei et al. |
| 2019/0085452 A1 | 3/2019 | Lei et al. |
| 2019/0088474 A1 | 3/2019 | MacDonald et al. |
| 2019/0090358 A1 | 3/2019 | Aresta et al. |
| 2019/0157078 A1 | 5/2019 | Van Schravendijk et al. |
| 2019/0163056 A1 | 5/2019 | Maes et al. |
| 2019/0189431 A1 | 6/2019 | Chandra et al. |
| 2019/0233446 A1 | 8/2019 | Macdonald et al. |
| 2019/0256532 A1 | 8/2019 | Fafard et al. |
| 2019/0311894 A1 * | 10/2019 | Girard ................. H01L 21/0214 |
| 2020/0010954 A1 | 1/2020 | Bhuyan et al. |
| 2020/0248309 A1 | 8/2020 | Wang et al. |
| 2020/0273697 A1 | 8/2020 | Suzuki et al. |
| 2021/0062341 A1 | 3/2021 | Bhuyan et al. |

FOREIGN PATENT DOCUMENTS

| | | |
|---|---|---|
| EP | 3553204 A2 | 10/2019 |
| JP | H08S2484 A | 4/1996 |
| KR | 20040080755 A | 9/2004 |
| TW | 201327679 A1 | 7/2013 |
| WO | 2009055340 A1 | 4/2009 |
| WO | 2009149167 A2 | 12/2009 |
| WO | 2018132568 A1 | 7/2018 |
| WO | 2021050368 A1 | 3/2021 |

OTHER PUBLICATIONS

Lee, Kwang-Man, et al., "Characteristics of SiOC(-H) Thin Films Prepared by Using Plasma-enhanced Atomic Layer Deposition". Journal of the Korean Physical Society, vol. 59, No. 5, Nov. 2011, pp. 3074-3079.*

Chen, Meixi, et al., "Deposition of SiOC by plasma-free ultra-low-temperature ALD (ULT-ALD) and its passivation on p-type silicon," 2017 IEEE 44th Photovoltaic Specialist Conference (PVSC), Washington, DC, USA, 2017, pp. 326-328.*

Non-Final Office Action in U.S. Appl. No. 16/550,486, mailed on May 27, 2021, 7 pages.

Non-Final Office Action in U.S. Appl. No. 16/950,096 dated Sep. 14, 2021, 13 pages.

PCT International Search Report and Written Opinion in PCT/US2020/047728 dated Nov. 17, 2020, 13 pages.

Ahn, Dongjoon, et al., "Thermodynamic measurements pertaining to the hysteretic intercalation of lithium in polymer-derived silicon oxycarbide", Journal of Power Sources 195 (2010), 3900-3906.

Closser, Richard G., "Molecular Layer Deposition of a Highly Stable Silicon Oxycarbide Thin Film Using an Organic Chlorosilane and Water", ACS Appl. Mater. Interfaces 2018, 10, 24266-24274.

Jeon, Eunjeong, et al., "Preparation of silicon oxycarbide amorphous ceramics from polymer precursors and the characterization of their high temperature stability", Journal of Ceramic Processing Research 13(3): 239-242.

Johnson, Andrew L., et al., "Recent developments in molecular precursors for atomic layer deposition", Organomet. Chem., 2019, 42, 1-53.

Kim, Hyunjun, "Characteristics of Silicon Oxycarbide Thin Films Deposited by Atomic Layer Deposition for Low-K Gate Spacer", Graduate School of Hanyang University, Thesis for the Master of Science, Feb. 2019, 1-48.

(56) References Cited

OTHER PUBLICATIONS

Lee, Jaemin, et al., "Characteristics of low-k SiOC films deposited via atomic layer deposition", Thin Solid Films 645 (2018), 334-339.
Takamura, N., et al., "Preparation of Silicon Oxycarbide Ceramic Films by Pyrolysis of Polymethyl- and Polyvinylsilsesquioxanes", Journal of Sol-Gel Science and Technology 16, 227-234 (1999).
Uznanski, Pawel, et al., "Surface modification of silicon oxycarbide films produced by remote hydrogen microwave plasma chemical vapour deposition from tetramethyldisiloxane precursor", Surface & Coatings Technology 350 (2018) 686-698.
Walkiewicz-Pietrzykowska, Agnieszka, et al., "Type of precursor and synthesis of silicon oxycarbide (SiOxCyH) thin films with a surfatron microwave oxygen/argon plasma", J. Vac. Sci. Technol. A 24(4), Jul./Aug. 2006, pp. 988-994.
Wrobel, Aleksander M., et al., "Silicon Oxycarbide Films Produced by Remote Microwave Hydrogen Plasma CVD using a Tetramethyldisiloxane Precursor: Growth Kinetics, Structure, Surface Morphology, and Properties", Chemical Vapor Deposition, 2015, 21, 307-318.
Non-Final Office Action in U.S. Appl. No. 17/068,188 dated Sep. 15, 2022, 9 pages.

\* cited by examiner

DEPOSITION OF LOW-K FILMS

CROSS-REFERENCE TO RELATED APPLICATIONS

This application is a Continuation of U.S. application Ser. No. 16/950,096, filed on Nov. 17, 2020, issued as U.S. Pat. No. 11,447,865 on Sep. 20, 2022, the entire disclosure of which is hereby incorporated by reference herein.

TECHNICAL FIELD

Embodiments of the present disclosure pertain to the field of electronic device manufacturing, and in particular, to integrated circuit (IC) manufacturing. More particularly, embodiments of the disclosure provide methods of depositing low-κ films.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

Atomic Layer Deposition (ALD) and Plasma-Enhanced ALD (PEALD) are deposition techniques that offer control of film thickness and conformality. Most ALD processes are based on binary reaction sequences, where each of the two surface reactions occurs sequentially. Because the surface reactions are sequential, the two gas phase reactants are not in contact, and possible gas phase reactions that may form and deposit particles are limited. Due to continuously decreasing device dimensions in the semiconductor industry, there is increasing interest and applications that use ALD/PEALD.

Low-k silicon-based dielectric films are important for the microelectronics manufacturing, e.g. as a spacer with low wet etch rate (about 0 A/min in 1:100 HF) and a k-value of about. The spacer should also maintain a low etch rate after being exposed to a moderate oxygen ($O_2$) plasma (2 KW remote plasma). Historically, silicon-based low-k films have been deposited by ALD in a furnace chamber. To achieve the desired film properties, the film needs to be deposited at temperatures above 500° C. With thermal budgets continually decreasing with every chip node, there is a need for the deposition of low-k films at temperatures below 500° C. Depositing silicon oxycarbide (SiOC) films by ALD using oxidation sources such as water or oxygen may result in a film with low carbon. In order to decrease etch rates, carbon levels need to be below 10% of the film.

Accordingly, there is a need for new deposition methods for silicon oxycarbide (SiOC) and silicon oxycarbonitride (SiOCN).

SUMMARY

Methods to manufacture integrated circuits are described. In one or more embodiments, a method of depositing a film on a substrate is described. The method comprises: exposing a substrate in a processing chamber to a silicon precursor to deposit a silicon-containing film on the substrate, the silicon precursor having a structure of general formulae (Ia), (Ib), (Ic), (Id), (IX), or (X)

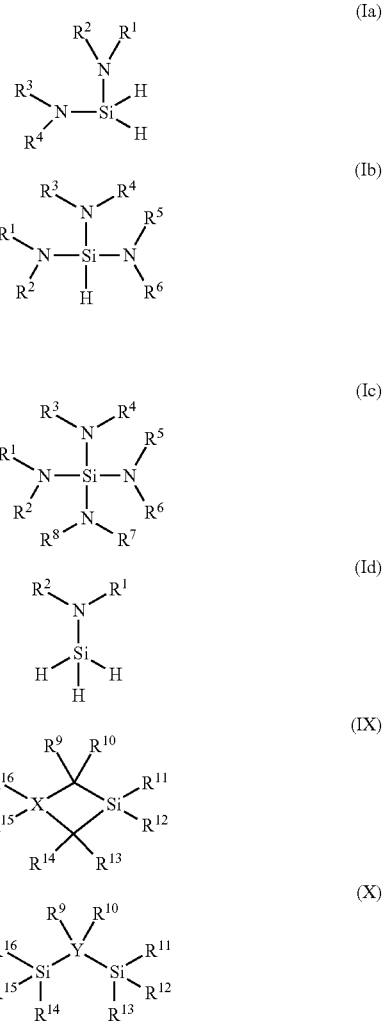

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl, X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide; purging the processing chamber of the silicon precursor; exposing the substrate to an oxidant to react with the silicon-containing film to form one or more of a silicon oxycarbide (SiOC) film or a silicon oxycarbonitride (SiOCN) film on the substrate, the oxidant comprising one or more of a carboxylic acid, an aldehyde, a ketone, an ethenediol, an oxalic acid, a glyoxylic acid, a peroxide, an alcohol, and a glyoxal; and purging the processing chamber of the oxidant.

In one or more embodiments, a method of depositing a film comprises: exposing a substrate to a silicon precursor of general formulae (Ia), (Ib), (Ic), (Id), (IX), or (X)

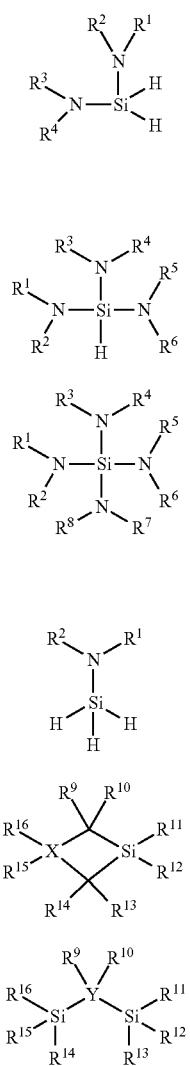

(Ia)

(Ib)

(Ic)

(Id)

(IX)

(X)

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl, X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide to form a silicon-containing film; exposing the substrate to an oxidant to react with the silicon-containing film to form one or more of a silicon oxycarbide (SiOC) film or a silicon oxycarbonitride (SiOCN) film on the substrate; and exposing the substrate to one or more of a strong oxidant or oxygen ($O_2$) plasma, the strong oxidant selected from one or more of ozone ($O_3$) and water ($H_2O$).

One or more embodiments are directed to a method of forming a nanolaminate. In one or more embodiments, the method comprises: a first deposition cycle and a second deposition cycle. The first deposition cycle comprises: exposing a substrate to a first silicon precursor of general formulae (Ia), (Ib), (Ic), and (Id):

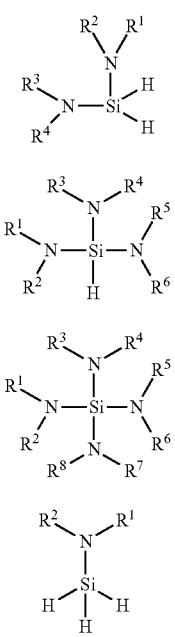

(Ia)

(Ib)

(Ic)

(Id)

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl to form a silicon-containing film, and exposing the substrate to a first oxidant to react with the silicon-containing film to form one or more of a silicon oxycarbide (SiOC) film or a silicon oxycarbonitride (SiOCN) film on the substrate. The second deposition cycle comprises: exposing the substrate with one or more of the silicon oxycarbide (SiOC) film or the silicon oxycarbonitride (SiOCN) film thereon to a second silicon precursor having general formula (IXI) or general formula (X)

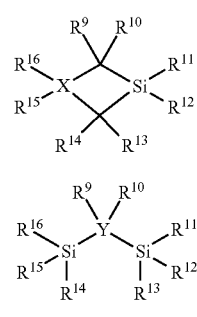

(IX)

(X)

wherein X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide to deposit a second silicon-containing film on the substrate; exposing the substrate to a second plasma to react with the second and silicon-containing film to form one or more of a silicon oxycarbide (SiOC) nanolaminate or a silicon oxycarbonitride (SiOCN) nanolaminate on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
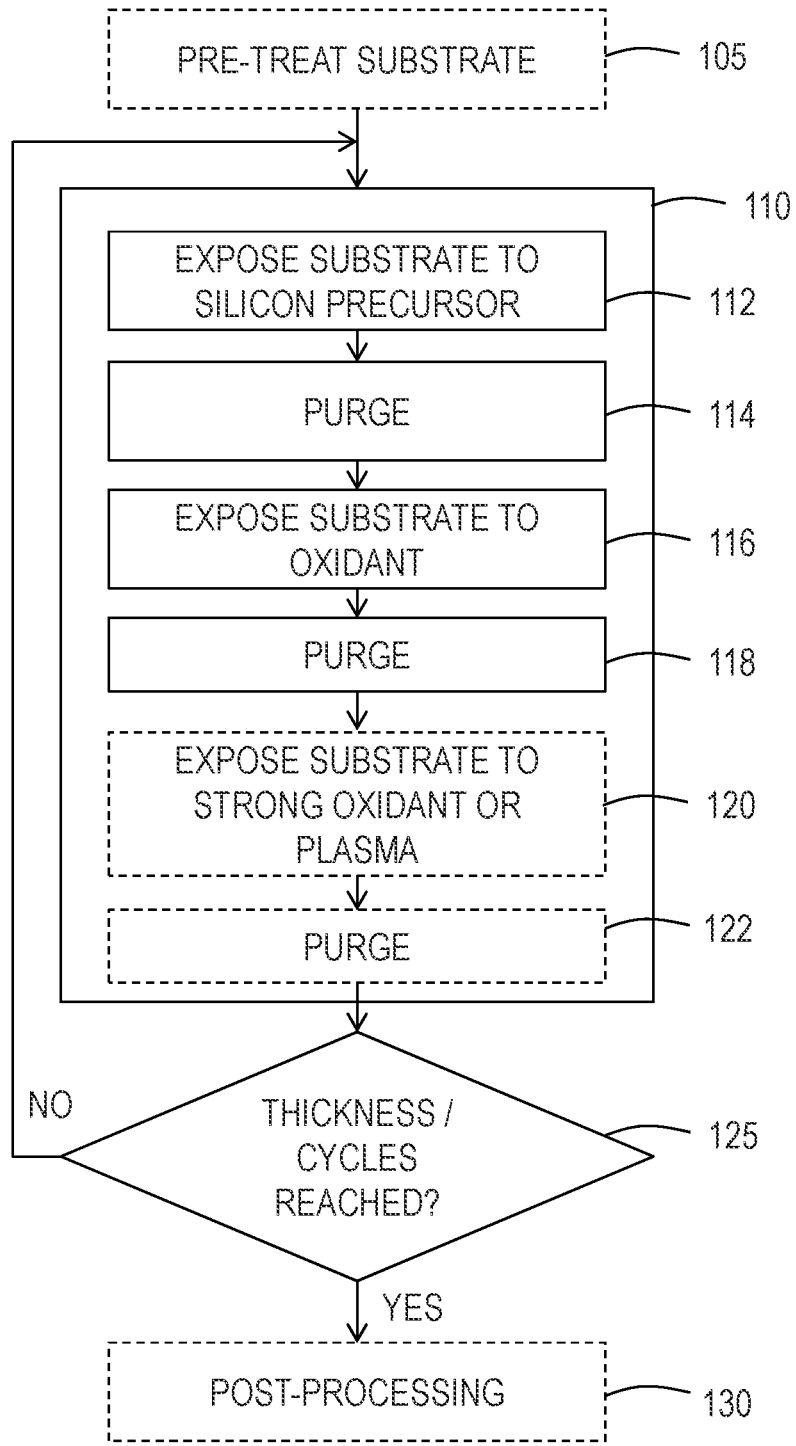
FIG. 1 depicts a flow diagram of a method for forming a low-κ film on a substrate in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

In one or more embodiments, provided is an atomic layer deposition (ALD) process for forming low-κ films, e.g. spacer films, using organosilane precursors. In one or more embodiments, the silicon precursors are of general formulae (Ia), (Ib), (Ic), and (Id):

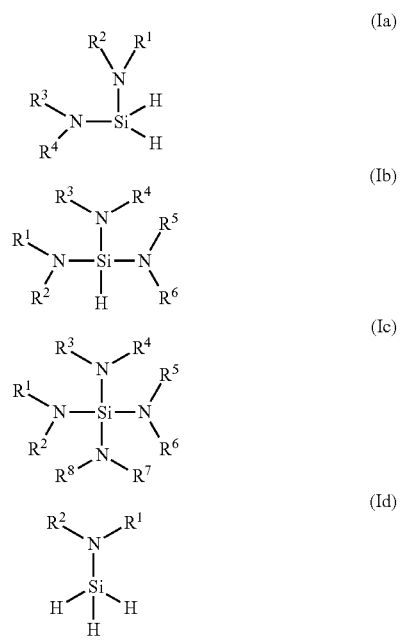

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl.

In one or more embodiments, the silicon precursor is any silicon precursor of general formula (IX) or general formula (X)

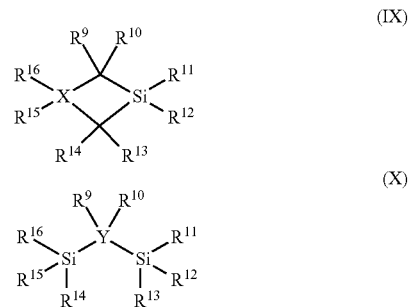

wherein X is silicon (Si) or carbon (C), Y is carbon (C) or oxygen (O), $R^9$, $R^{10}$, $R^{11}$, $R^{12}$, $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide that can react with (i.e., adsorb or chemisorb onto) the surface to leave a silicon-containing species on the surface.

In one or more embodiments X is silicon (Si). In one or more embodiments, X is carbon (C). In one or more embodiments Y is carbon (C). In one or more embodiments, Y is oxygen (O). In one or more embodiments, at least one of $R^9$, $R^{10}$, $R^{11}$, $R^{12}$ $R^{13}$, $R^{14}$, $R^{15}$, and $R^{16}$ comprises a substituted or unsubstituted amine. In one or more embodiments, at least one of $R^9$, $R^{10}$, $R^{11}$, $R^{12}$ $R^{13}$, $R^{14}$, $R^{15}$, and $R^{16}$ comprises —$NR^cR^d$ where $R^c$ and $R^d$ independently comprise $C_{1-8}$ alkyl or $C_{1-8}$ aryl. In one or more embodiments, at least one of $R^9$, $R^{10}$, $R^{11}$, $R^{12}$ $R^{13}$, $R^{14}$, $R^{15}$, and $R^{16}$ comprises —$NMe_2$. As recognized by one of skill in the art, the group —$NMe_2$ is a dimethyl amine, wherein the linkage to the compound of general formula (IX) or general formula (X) occurs through the nitrogen atom.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one or more embodiments, the purge gas is selected from one or more of argon (Ar), nitrogen ($N_2$), or helium (He). In one or more embodiments, the same purge gas is used to purge the precursor and the oxidant. In other embodiments, a different purge gas is used to purge the processing chamber of the precursor than the purge gas used to purge the processing chamber of the oxidant.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Plasma enhanced atomic layer deposition (PEALD) is a widely used technique for depositing thin films on a substrate. In some examples of PEALD processes, a material may be formed from the same chemical precursors as thermal ALD processes, but at a higher deposition rate and a lower temperature. A PEALD process, in general, provides that a reactant gas and a reactant plasma are sequentially introduced into a process chamber containing a substrate. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step maybe conducted between the delivery of each of the reactants. Embodiments described herein in reference to a PEALD process can be carried out using any suitable thin film deposition system. Any apparatus description described herein is illustrative and should not be construed or interpreted as limiting the scope of the embodiments described herein.

Plasma enhanced chemical vapor deposition (PECVD) is used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

In some embodiments, the films described herein may be formed by atomic layer deposition (plasma enhanced and/or thermal) processes using a silicon precursor including one or more precursor of general formulae (Ia), (Ib), (Ic), and (Id):

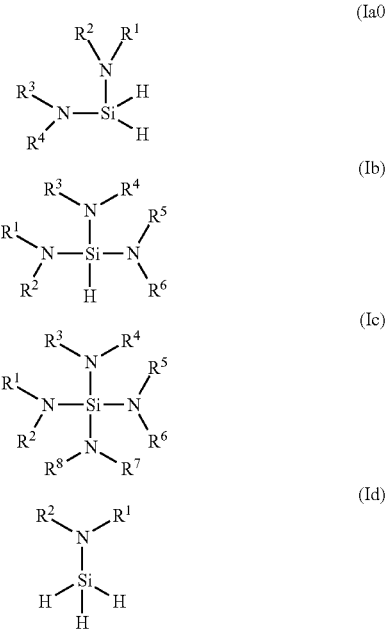

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface.

In other embodiments, the films described herein may be formed using a silicon precursor including one or more precursor of general formula (XX)

$R^a$ and $R^b$, are independently selected from hydrogen (H), substituted or unsubstituted alkyl, substituted or unsubstituted alkoxy, and substituted or unsubstituted vinyl, and z is an integer in a range of from 1 to 4. The precursor of general Formula (XX) can react with (i.e., adsorb or chemisorb onto) the substrate surface to leave a silicon-containing species on the substrate surface.

In other embodiments, the silicon precursor is any silicon precursor of general formula (IX) or general formula (X)

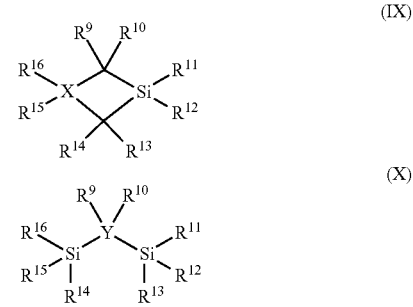

wherein X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide that can react with (i.e., adsorb or chemisorb onto) the surface to leave a silicon-containing species on the surface.

In one or more embodiments X is silicon (Si). In one or more embodiments, X is carbon (C). In one or more embodiments Y is carbon (C). In one or more embodiments, Y is oxygen (O). In one or more embodiments, at least one of $R^9$, $R^{10}$, $R^{11}$, $R^{12}$ $R^{13}$, $R^{14}$, $R^{15}$, and $R^{16}$ comprises a substituted or unsubstituted amine. In one or more embodiments, at least one of $R^9$, $R^{10}$, $R^{11}$, $R^{12}$ $R^{13}$, $R^{14}$, $R^{15}$, and $R^{16}$ comprises —$NR^cR^d$ where $R^c$ and $R^d$ independently comprise $C_{1-8}$ alkyl or $C_{1-8}$ aryl. In one or more embodiments, at least one of $R^9$, $R^{10}$, $R^{11}$, $R^{12}$ $R^{13}$, $R^{14}$, $R^{15}$, and $R^{16}$ comprises —$NMe_2$. As recognized by one of skill in the art, the group —$NMe_2$ is a dimethyl amine, wherein the linkage to the compound of general formula (IX) or general formula (X) occurs through the nitrogen atom.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

As used herein, the term "alkoxy" includes any of the above alkyl groups linked to an oxygen atom. The alkoxy may be substituted or unsubstituted.

As used herein, the terms "vinyl" or "vinyl-containing" refer to groups containing the vinyl group (—CH=CH$_2$). The vinyl may be substituted or unsubstituted.

As used herein, the term "amine" relates to any organic compound containing at least one basic nitrogen atom, e.g. NR'$_2$, wherein R' is independently selected from hydrogen (H) or alkyl. The alkyl of the amine may be substituted or unsubstituted.

As used herein, the term "silane" refers to a compound SiR'$_3$, wherein R' is independently selected from hydrogen (H) or alkyl. The alkyl of the silane may be substituted or unsubstituted.

As used herein, the term "halide" refers to a binary phase, of which one part is a halogen atom and the other part is an element or radical that is less electronegative than the halogen, to make a fluoride, chloride, bromide, or iodide compound. A halide ion is a halogen atom bearing a negative charge. As known to those of skill in the art, a halide anion includes fluoride (F—), chloride (Cl—), bromide (Br—), and iodide.

The deposition process may be carried out at temperatures ranging from about 200° C. to about 650° C., including about 225° C., about 250° C., about 275° C., about 300° C., about 325° C., about 350° C., about 375° C., about 400° C., about 425° C., about 450° C., about 475° C., about 500° C., about 525° C., about 550° C., about 575° C., about 600° C., about 625° C., and about 650° C.

The deposition process may be carried out in a process volume at pressures ranging from 0.1 mTorr to 500 Torr, including a pressure of about 0.1 mTorr, about 10 mTorr, about 100 mTorr, about 1000 mTorr, about 5000 mTorr, about 10 Torr, about 20 Torr, about 30 Torr, about 40 Torr, about 50 Torr, about 60 Torr, about 70 Torr, about 80 Torr, about 90 Torr, about 100 Torr, about 150 Torr, about 200 Torr, about 250 Torr, about 300 Torr, about 350 Torr, about 400 Torr, about 350 Torr, and about 500 Torr.

In one or more embodiments, the silicon precursor is flowed into the processing chamber as a gas. In one or more embodiments, the precursor-containing gas further includes one or more of a dilution gas selected from helium (He), argon (Ar), xenon (Xe), nitrogen (N$_2$), or hydrogen (H$_2$). The dilution gas of some embodiments comprises a compound that is inert gas relative to the reactants and substrate materials.

In one or more embodiments, the precursor-containing gas further includes etchant gases such as Cl$_2$, CF$_4$, or NF$_3$ to improve film quality.

In one or more embodiments, the oxidant comprises one or more of the oxidant comprising one or more of a carboxylic acid, an aldehyde, a ketone, an ethenediol, an oxalic acid, a glyoxylic acid, a peroxide, an alcohol, and a glyoxal.

In one or more embodiments, the oxidant comprises a structure of Formula (II), Formula (III), Formula (IV), Formula (V), Formula (VI), Formula (VII), and Formula (VIII):

(II)

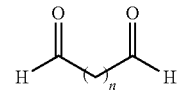
(III)

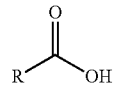
(IV)

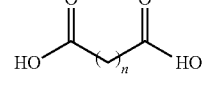
(IV)

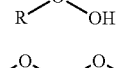
(V)

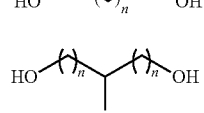
(VI)

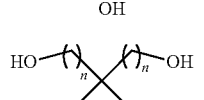
(VII)

(VIII)

wherein R is selected from the group consisting of C$_1$-C$_6$ alkyl, C$_1$-C$_6$ alkene, C$_1$-C$_6$ alkyne, C$_5$-C$_8$ aryl, and n is an integer from −1 to 6. In some embodiments, n is an integer selected from −1, 0, 1, 2, 3, 4, 5, and 6. In other embodiments, n is an integer in a range of from 1 to 6 and includes 1, 2, 3, 4, 5, and 6.

As used herein, the term "alkene" or "alkenyl" or "lower alkenyl" refers to straight or branched chain radicals of 2 to 20 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonyl-amino, nitro, cyano, thiol, alkylthio, and/or any of the alkyl substituents set out herein.

As used herein, the term "alkynyl" or "lower alkynyl" refers to straight or branched chain radicals of 2 to 20 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

The term "halogen" or "halo" as used herein alone or as part of another group refers to chlorine (Cl), bromine (Br), fluorine (F), and iodine (I), as well as $CF_3$.

In one or more embodiments, the low-κ dielectric film may be deposited to a thickness greater than about 0.1 nm. In other embodiments, the low-κ dielectric film may be deposited to a thickness in a range of about 0.1 nm to about 100 nm, or about 0.5 nm to about 100 nm, including about 0.1 nm, about 1 nm, about 10 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, or about 100 nm.

In one or more embodiments, a low-k film is deposited on a substrate. The low-k film of one or more embodiments, advantageously has a wet etch rate (WER) in range of about 0.1 Å/min to about 10 Å/min in hydrofluoric acid (1:100 HF), including about 0.1 Å/min, about 0.5 Å/min, about 1 Å/min, about 2 Å/min, about 3 Å/min, about 4 Å/min, about 5 Å/min, about 6 Å/min, about 7 Å/min, about 8 Å/min, about 9 Å/min, and about 10 Å/min. The low-k film of one or more embodiments, advantageously has high ashing resistance. In one or more embodiments, the low-k film has a dielectric constant or extinction coefficient or k-value in a range of about 2.0 to about 6.0, including about 2.25, about 2.5, about 2.75, about 3.0, about 3.25, about 3.5, about 3.75, about 4.0, about 4.25, about 4.5, about 4.75, about 5.0, about 5.25, about 5.5, about 5.75, or about 6.0.

In one or more embodiments, the density of the low-κ film is greater than about 2.1 g/cc.

With reference to FIG. 1, one or more embodiments of the disclosure are directed to method 100 of depositing a thin film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film. In some embodiments, the method comprises a plasma enhanced atomic layer deposition (PEALD process).

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at pre-treatment operation 105.

At deposition operation 110, a process is performed to deposit a silicon-containing thin film on the substrate (or substrate surface). The deposition process can include one or more operations to form a film on the substrate. In operation 112, the substrate (or substrate surface) is exposed to a silicon precursor to deposit a film on the substrate (or substrate surface). In one or more embodiments, the silicon precursor is any silicon precursor of general formulae (Ia), (Ib), (Ic), and (Id):

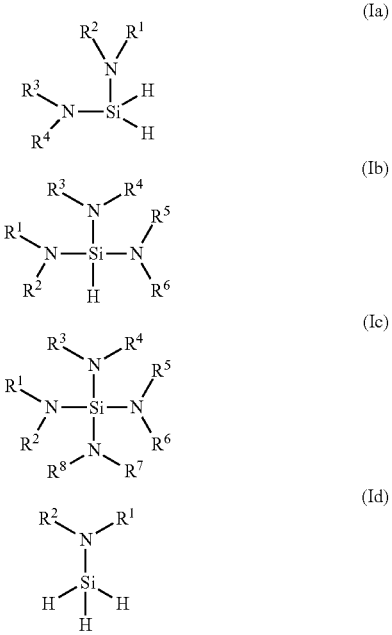

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface.

In one or more embodiments, the silicon precursor comprises

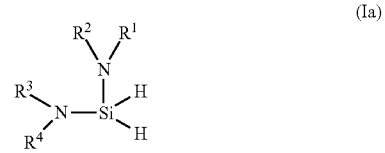

wherein $R^1$, $R^2$, $R^3$, $R^4$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface. In one or more embodiments, the silicon precursor comprises

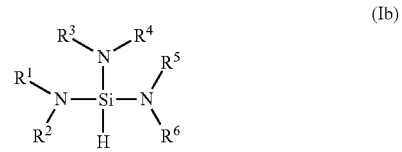

wherein $R^1$, $R^2$, $R^3$, $R^4$, $R^5$, $R^6$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface. In one or more embodiments, the silicon precursor comprises

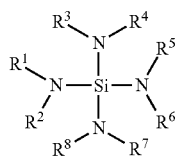

(Ic)

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface. In one or more embodiments, the silicon precursor comprises

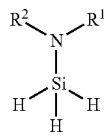

(Id)

wherein $R^1$, $R^2$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface.

In other embodiments, the silicon precursor is any silicon precursor of general formula (IX) or general formula (X)

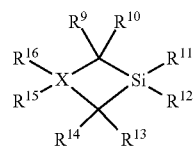

(IX)

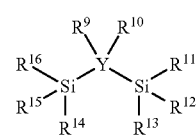

(X)

wherein X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide that can react with (i.e., adsorb or chemisorb onto) the surface to leave a silicon-containing species on the surface. In one or more embodiments X is silicon (Si). In one or more embodiments, X is carbon (C). In one or more embodiments Y is carbon (C). In one or more embodiments, Y is oxygen (O). In one or more embodiments, at least one of $R^9$, $R^{10}$, $R^{11}$, $R^{12}$ $R^{13}$, $R^{14}$, $R^{15}$, and $R^{16}$ comprises a substituted or unsubstituted amine. In one or more embodiments, at least one of $R^9$, $R^{10}$, $R^{11}$, $R^{12}$ $R^{13}$, $R^{14}$, $R^{15}$, and $R^{16}$ comprises —$NMe_2$. As recognized by one of skill in the art, the group —$NMe_2$ is a dimethyl amine, wherein the linkage to the compound of general formula (IX) or general formula (X) occurs through the nitrogen atom.

In one or more embodiments, the silicon precursor comprises one or more of

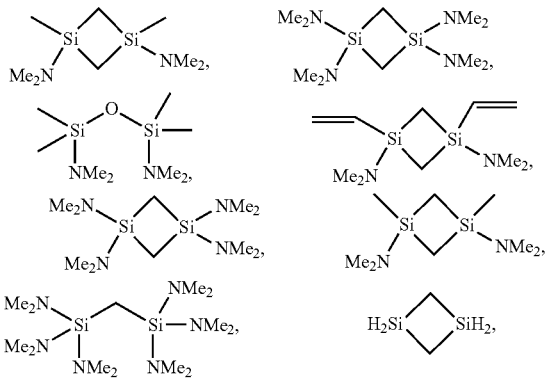

or the like.

In some embodiments, the silicon precursor comprises one or more of bis(diethylamino)silane, bis(dimethylamine) silane, bis(dipropylamino)silane, dimethylamino diethylamino silane, tris(dimethylamino)silane, tetrakis(dimethylamino)silane, 1,1-Bis(dimethylamino)-3,3-bis (dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, and 1,3-disilacyclobutane. As used in this manner, the term "consists essentially of" means that the silicon precursor comprises greater than or equal to about 95%, 98%, 99% or 99.5% of comprises one or more of bis(diethylamino)silane, bis(dimethylamine)silane, bis(dipropylamino)silane, dimethylamino diethylamino silane, tris(dimethylamino)silane, tetrakis(dimethylamino)silane, 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, and 1,3-disilacyclobutane on a molecular basis. The presence of diluent, carrier and/or inert gases, for example, is not taken into consideration in the calculation.

In one or more embodiments, the substrate (or substrate surface) can be any suitable surface. Suitable surfaces include, but are not limited to, silicon (Si), silicon dioxide ($SiO_2$), silicon oxide ($SiO_x$), silicon oxycarbide (SiOC), platinum (Pt), titanium nitride (TiN), tantalum nitride (TaN), copper (Cu), cobalt (Cu), tungsten (W), ruthenium (Ru), molybdenum (Mo) or combinations thereof.

At operation 114, the processing chamber is purged to remove unreacted silicon precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the silicon precursor by any suitable technique including, but not limited to, moving the substrate through a gas curtain to a portion or sector of the processing chamber that contains none or substantially none of the silicon precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is exposed to an oxidizing agent (or oxidant) to form one or more of a silicon oxycarbide (SiOC) or silicon oxycarbonitride (SiOCN) film on the substrate. The oxidizing agent can react with the silicon-containing species (e.g. silicon-containing film) on the substrate surface to form one or more of a silicon oxycarbide (SiOC) or silicon oxycarbonitride (SiOCN) film. In some embodiments, the oxidizing agent comprises one or more of a carboxylic acid, an aldehyde, a ketone, an ethenediol, an oxalic acid, a glyoxylic acid, a peroxide, an alcohol, and a glyoxal. In some embodiments, the oxidizing agent comprises a structure of Formula (II), Formula (III), Formula (IV), Formula (V), Formula (VI), Formula (VII), and Formula (VIII):

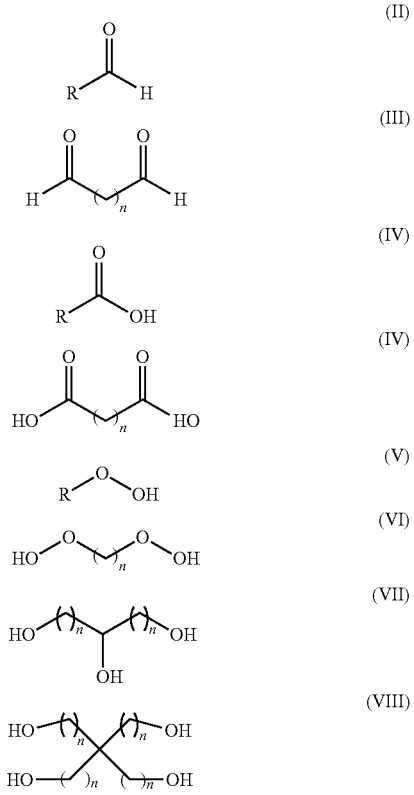

wherein R is selected from the group consisting of $C_1$-$C_6$ alkyl, $C_1$-$C_6$ alkene, $C_1$-$C_6$ alkyne, $C_5$-$C_8$ aryl, and n is an integer from −1 to 6.

At operation 118, the processing chamber is purged after exposure to the oxidizing agent. Purging the processing chamber in operation 118 can be the same process or different process than the purge in operation 114. Purging the processing chamber, portion of the processing chamber, area adjacent the substrate surface, etc., removes unreacted oxidizing agent, reaction products and by-products from the area adjacent the substrate surface.

In some embodiments, the deposition process comprises a plasma enhanced atomic layer deposition process (PEALD). After forming silicon oxycarbide (SiOC) or silicon oxycarbonitride (SiOCN) film on the substrate, the substrate may be optionally exposed to a strong oxidant or oxygen ($O_2$) plasma at operation 120. In one or more embodiments, the strong oxidant is selected from one or more of ozone ($O_3$) or water ($H_2O$).

In one or more embodiments, exposing the silicon oxycarbide (SiOC) or silicon oxycarbonitride (SiOCN) film to an oxygen ($O_2$) plasma in the processing chamber improves the growth rate and helps maintain a high carbon content in the silicon oxycarbide (SiOC) or silicon oxycarbonitride (SiOCN) film. In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

At operation 122, the processing chamber is purged after exposure to the strong oxidant or the oxygen ($O_2$) plasma. Purging the processing chamber in operation 122 can be the same process or different process than the purge in operation 114 and/or operation 118. Purging the processing chamber, portion of the processing chamber, area adjacent the substrate surface, etc., removes the strong oxidant, plasma, reaction products and by-products from the area adjacent the substrate surface.

At decision 125, the thickness of the deposited film, or number of cycles of silicon-precursor and oxidizing agent is considered. If the deposited film has reached a predetermined thickness or a predetermined number of process cycles have been performed, the method 100 moves to a post-processing operation 130. If the thickness of the deposited film or the number of process cycles has not reached the predetermined threshold, the method 100 returns to deposition operation 110 to expose the substrate surface to the silicon precursor again in operation 112, and continuing.

The post-processing operation 130 can be, for example, a process to modify film properties (e.g., annealing) or a further film deposition process (e.g., additional ALD or CVD processes) to grow additional films. In some embodiments, the post-processing operation 130 can be a process that modifies a property of the deposited film. In some embodiments, the post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the silicon precursor, oxidizing agent or thermal budget of the device. In some embodiments, exposures to the silicon precursor (operation 112) and the oxidizing agent (operation 116) occur at the same temperature. In some embodiments, the substrate is maintained at a temperature in a range of about 200° C. to about 650° C., or in the range of about 350° C. to about 500° C.

In some embodiments, exposure to the silicon precursor (operation 112) occurs at a different temperature than the exposure to the oxidizing agent (operation 116). In some embodiments, the substrate is maintained at a first temperature in a range of about 300° C. to about 650° C. for the exposure to the silicon precursor, and at a second temperature in the range of about 200° C. to about 650° C. for exposure the oxidizing agent.

In the embodiment illustrated in FIG. 1, deposition operation 110 the substrate (or substrate surface) is exposed to the silicon precursor and the oxidizing agent sequentially. In another, un-illustrated, embodiment, the substrate (or substrate surface) is exposed to the silicon precursor and the oxidizing agent simultaneously in a CVD reaction. In a CVD reaction, the substrate (or substrate surface) can be exposed to a gaseous mixture of the silicon precursor and oxidizing agent to deposit one or more of a silicon oxycarbide (SiOC) or silicon oxycarbonitride (SiOCN) film having a predetermined thickness. In the CVD reaction, one or more of a silicon oxycarbide (SiOC) or silicon oxycarbonitride (SiOCN) film can be deposited in one exposure to the mixed reactive gas, or can be multiple exposures to the mixed reactive gas with purges between.

In one or more embodiments, the silicon oxycarbide (SiOC) film has a carbon content of greater than or equal to about 5%, 7.5%, 10%, 12.5 or 15%, on an atomic basis. In some embodiments, the silicon oxycarbide (SiOC) film comprises a carbon content in the range of about 2% to about 50%, or in the range of about 3% to about 45%, or in the range of about 4% to about 40%, on an atomic basis. In some embodiments, the silicon oxycarbide (SiOC) film has no nitrogen present.

In one or more embodiments, the silicon oxycarbonitride (SiOCN) film has a nitrogen content of greater than or equal to about 0%, 5%, 7.5%, 10%, 12.5 or 15%, on an atomic basis. In some embodiments, the silicon oxycarbonitride (SiOCN) film comprises a nitrogen content in the range of about 0% to about 40%, or in the range of about 3% to about 35%, or in the range of about 4% to about 30%, on an atomic basis.

The deposition operation 110 can be repeated to form one or more of a silicon oxycarbide (SiOC) or silicon oxycarbonitride (SiOCN) film having a predetermined thickness. In some embodiments, the deposition operation 110 is repeated to provide one or more of a silicon oxycarbide (SiOC) or silicon oxycarbonitride (SiOCN) film having a thickness greater than about 0.1 nm, or in the range of about 0.1 nm to about 1000 nm.

In one or more embodiments, the low-k silicon oxycarbide (SiOC) film or silicon oxycarbonitride (SiOCN) film is used as a spacer.

Figure 2:
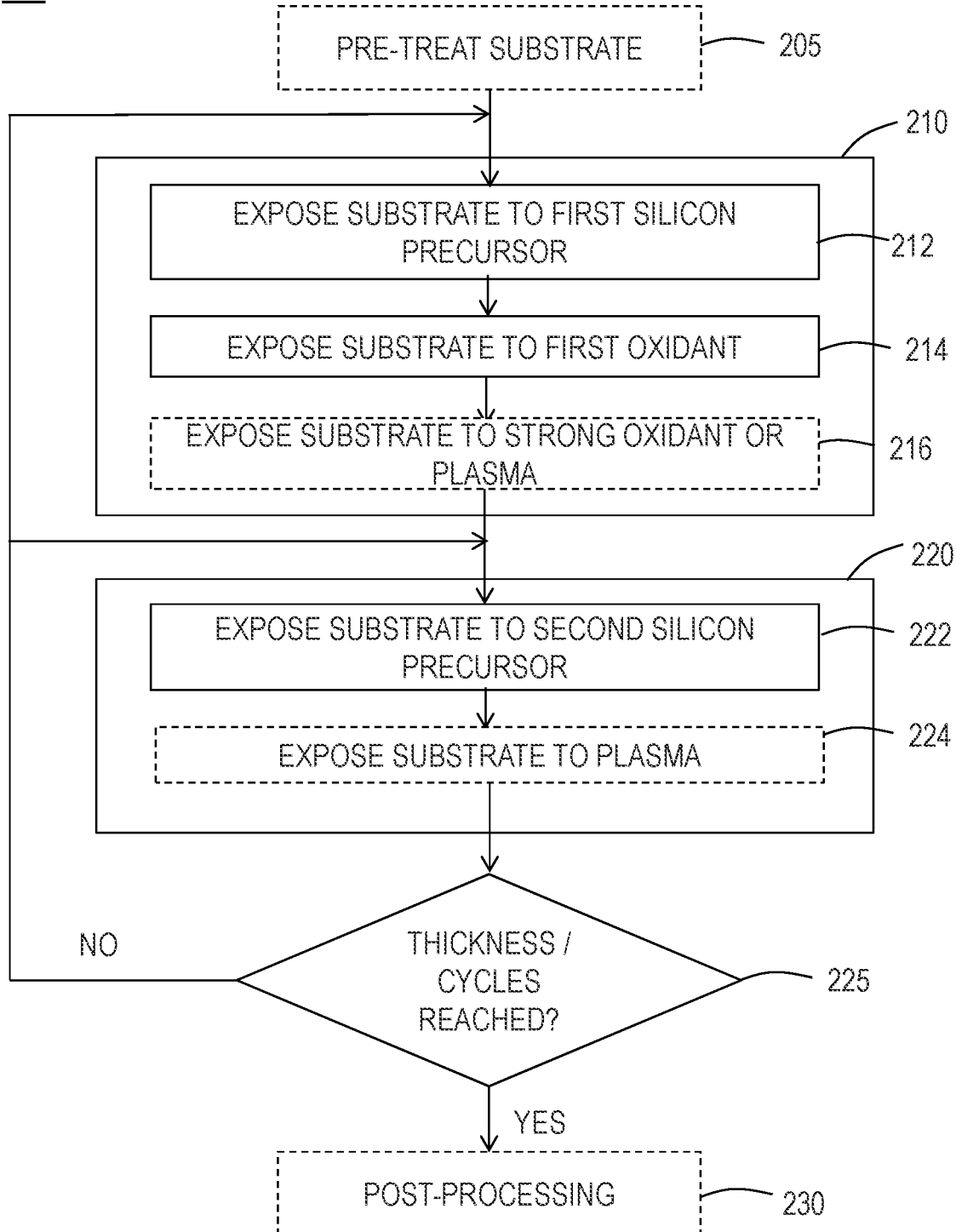
FIG. 2 depicts a flow diagram of a method for forming a low-κ film on a substrate in accordance with one or more embodiments.

With reference to FIG. 2, one or more embodiments of the disclosure are directed to method 200 of depositing a thin film. The method 200 comprises a first deposition cycle 210 and a second deposition cycle 220.

In some embodiments, the method 200 includes a pre-treatment operation 205. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at pre-treatment operation 205.

At first deposition cycle 210, a process is performed to deposit a silicon-containing thin film on the substrate (or substrate surface). The deposition process can include one or more operations to form a film on the substrate. In operation 212, the substrate (or substrate surface) is exposed to a first silicon precursor to deposit a film on the substrate (or substrate surface). general formulae (Ia), (Ib), (Ic), and (Id):

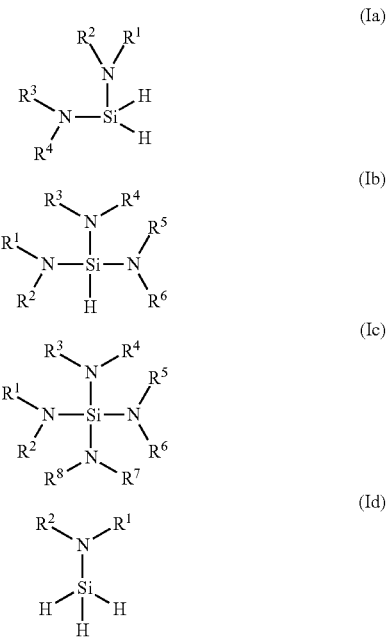

wherein $R^1$, $R^2$, $R^3$, $R^4$, $R^5$, $R^6$, $R^7$, and $R^8$ are independently selected from hydrogen (H), substituted or unsubstituted alkyl, substituted or unsubstituted alkoxy, and substituted or unsubstituted vinyl that can react with (i.e., adsorb or chemisorb onto) the substrate surface to leave a silicon-containing species on the substrate surface.

In some embodiments, the first silicon precursor comprises one or more of bis(diethylamino)silane, bis(dimethylamine)silane, bis(dipropylamino)silane, dimethylamino diethylamino silane, tris(dimethylamino)silane, and tetrakis(dimethylamino)silane. As used in this manner, the term "consists essentially of" means that the silicon precursor comprises greater than or equal to about 95%, 98%, 99% or 99.5% of one or more of bis(diethylamino)silane, bis(dimethylamine)silane, bis(dipropylamino)silane, dimethylamino diethylamino silane, tris(dimethylamino)silane, and tetrakis(dimethylamino)silane. on a molecular basis. The presence of diluent, carrier and/or inert gases, for example, is not taken into consideration in the calculation.

The processing chamber may then be purged to remove unreacted first silicon precursor, reaction products and by-products. At operation 214, the substrate (or substrate surface) is exposed to a first oxidizing agent (or oxidant) to form one or more of a silicon oxycarbide (SiOC) or silicon oxycarbonitride (SiOCN) film on the substrate. The oxidizing agent can react with the silicon-containing species (e.g. silicon-containing film) on the substrate surface to form one or more of a silicon oxycarbide (SiOC) or silicon oxycarbonitride (SiOCN) film. In some embodiments, the first oxidizing agent comprises one or more of a carboxylic acid, an aldehyde, a ketone, an ethenediol, an oxalic acid, a glyoxylic acid, a peroxide, an alcohol, and a glyoxal. In some embodiments, the first oxidizing agent comprises a structure of Formula (II), Formula (III), Formula (IV), Formula (V), Formula (VI), Formula (VII), and Formula (VIII):

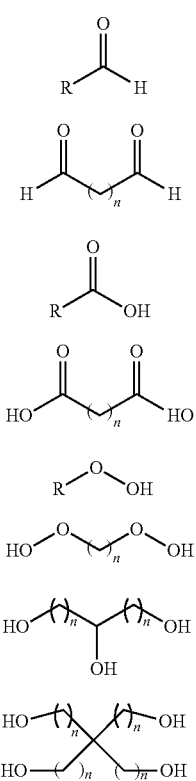

wherein R is selected from the group consisting of $C_1$-$C_6$ alkyl, $C_1$-$C_6$ alkene, $C_1$-$C_6$ alkyne, $C_5$-$C_8$ aryl, and n is an integer from −1 to 6.

The processing chamber may then be purged after exposure to the first oxidizing agent. Purging the processing chamber can be the same process or different process than the purge after exposure to the first silicon precursor.

In some embodiments, the deposition process comprises a plasma enhanced atomic layer deposition process (PEALD). After forming silicon oxycarbide (SiOC) or silicon oxycarbonitride (SiOCN) film on the substrate, the substrate may be optionally exposed to a strong oxidant or oxygen ($O_2$) plasma at operation 216. In one or more embodiments, the strong oxidant is selected from one or more of ozone ($O_3$) and water ($H_2O$).

In one or more embodiments, exposing the silicon oxycarbide (SiOC) or silicon oxycarbonitride (SiOCN) film to an oxygen ($O_2$) plasma in the processing chamber improves the growth rate and helps maintain a high carbon content in the silicon oxycarbide (SiOC) or silicon oxycarbonitride (SiOCN) film. In some embodiments, the plasma is a remote plasma. In other embodiments, the plasma is a direct plasma.

In one or more embodiments, the plasma may be generated remotely or within the processing chamber, as described above with respect to method 100. The processing chamber may then be purged after exposure to the strong oxidant or the oxygen ($O_2$) plasma. Purging the processing chamber can be the same process or different process than the prior purges. Purging the processing chamber, portion of the processing chamber, area adjacent the substrate surface, etc., removes the strong oxidant, plasma, reaction products and by-products from the area adjacent the substrate surface.

At second deposition cycle 220, a process is performed to deposit a second silicon-containing thin film on the of the silicon oxycarbide (SiOC) film or the silicon oxycarbonitride (SiOCN) film. The deposition process can include one or more operations to form a film on the substrate. In operation 222, the substrate with one or more of the silicon oxycarbide (SiOC) film or the silicon oxycarbonitride (SiOCN) film thereon is exposed to a second silicon precursor to deposit a second silicon-containing film on the substrate (or substrate surface). In one or more embodiments, the second silicon precursor is any silicon precursor of general formula (IXI) or general formula (X)

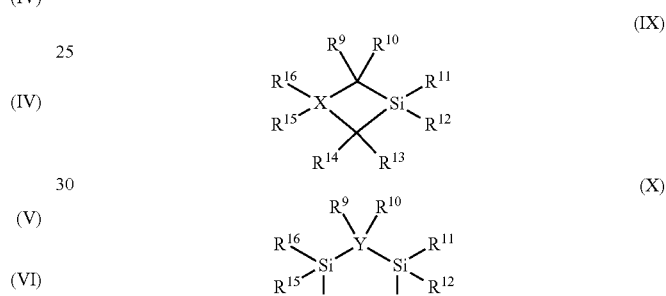

wherein X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide that can react with (i.e., adsorb or chemisorb onto) the surface to leave a silicon-containing species on the surface.

In one or more embodiments X is silicon (Si). In one or more embodiments, X is carbon (C). In one or more embodiments Y is carbon (C). In one or more embodiments, Y is oxygen (O). In one or more embodiments, at least one of $R^9$, $R^{10}$, $R^{11}$, $R^{12}$ $R^{13}$, $R^{14}$, $R^{15}$, and $R^{16}$ comprises a substituted or unsubstituted amine. In one or more embodiments, at least one of $R^9$, $R^{10}$, $R^{11}$, $R^{12}$ $R^{13}$, $R^{14}$, $R^{15}$, and $R^{16}$ comprises —$NR^cR^d$ where $R^c$ and $R^d$ independently comprise $C_{1-8}$ alkyl or $C_{1-8}$ aryl. In one or more embodiments, at least one of $R^9$, $R^{10}$, $R^{11}$, $R^{12}$ $R^{13}$, $R^{14}$, $R^{15}$, and $R^{16}$ comprises —$NMe_2$. As recognized by one of skill in the art, the group —$NMe_2$ is a dimethyl amine, wherein the linkage to the compound of general formula (IX) or general formula (X) occurs through the nitrogen atom.

As used herein, the term "amine" relates to any organic compound containing at least one basic nitrogen atom, e.g. $NR'_2$, wherein R' is independently selected from hydrogen (H) or alkyl. The alkyl of the amine may be substituted or unsubstituted.

As used herein, the term "silane" refers to a compound $SiR'_3$, wherein R' is independently selected from hydrogen (H) or alkyl. The alkyl of the silane may be substituted or unsubstituted.

As used herein, the term "halide" refers to a binary phase, of which one part is a halogen atom and the other part is an element or radical that is less electronegative than the halogen, to make a fluoride, chloride, bromide, or iodide, compound. A halide ion is a halogen atom bearing a negative charge. As known to those of skill in the art, a halide anion includes fluoride (F—), chloride (Cl—), bromide (Br—), and iodide (I—).

In one or more embodiments, the second silicon precursor comprises one or more of

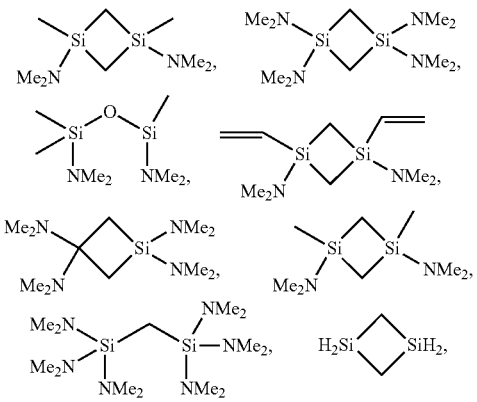

or the like.

In some embodiments, the second silicon precursor comprises one or more of 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, or 1,3-disilacyclobutane. In some embodiments, the silicon precursor consists essentially of 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl, or 1,3-disilacyclobutane methane. As used in this manner, the term "consists essentially of" means that the second silicon precursor comprises greater than or equal to about 95%, 98%, 99% or 99.5% of 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, or 1,3-disilacyclobutane, on a molecular basis. The presence of diluent, carrier and/or inert gases, for example, is not taken into consideration in the calculation.

The processing chamber may then be purged to remove unreacted second silicon precursor, reaction products and by-products. At operation 224, the surface is exposed to a second plasma. In one or more embodiments, the second plasma comprises one or more of nitrogen ($N_2$), argon (Ar), helium (He), hydrogen ($H_2$), carbon monoxide (CO), or carbon dioxide ($CO_2$). In some embodiments, the second plasma is a remote plasma. In other embodiments, the second plasma is a direct plasma.

In one or more embodiments, the second plasma may be generated remotely or within the processing chamber. In one or more embodiments, the second plasma is an inductively coupled plasma (ICP) or a conductively coupled plasma (CCP). Any suitable power can be used depending on, for example, the reactants, or the other process conditions. In some embodiments, the second plasma is generated with a plasma power in the range of about 10 W to about 3000 W. In some embodiments, the second plasma is generated with a plasma power less than or equal to about 3000 W, less than or equal to about 2000 W, less than or equal to about 1000 W, less than or equal to about 500 W, or less than or equal to about 250 W.

The processing chamber may be purged after exposure to the second plasma. Purging the processing chamber in operation can be the same process or different process than the prior purge processes. Purging the processing chamber, portion of the processing chamber, area adjacent the substrate surface, etc., removes second plasma, reaction products and by-products from the area adjacent the substrate surface.

At decision 225, the thickness of the nanolaminate film, or number of cycles of silicon-precursor(s) and oxidizing agent is considered. If the nanolaminate has reached a predetermined thickness or a predetermined number of process cycles have been performed, the method 200 moves to a post-processing operation 230. If the thickness of the nanolaminate film or the number of process cycles has not reached the predetermined threshold, the method 200 returns to first deposition cycle 210 or second deposition cycle 220 to expose the substrate surface to the silicon precursor(s) again in operation 212, and continuing or in operation 222 and continuing. In one or more embodiments, one or more of the first deposition cycle or the second deposition cycle may be repeated to form one or more of the silicon oxycarbide (SiOC) nanolaminate or the silicon oxycarbonitride (SiOCN) nanolaminate having a thickness of about 0.5 to about 10 nm.

The first deposition cycle 210 and the second deposition cycle 220 can be repeated to form one or more of a silicon oxycarbide (SiOC) nanolaminate or silicon oxycarbonitride (SiOCN) nanolaminate having a predetermined thickness. In some embodiments, one or more of the first deposition cycle 210 and the second deposition cycle 220 are repeated to provide one or more of a silicon oxycarbide (SiOC) nanolaminate or silicon oxycarbonitride (SiOCN) nanolaminate having a thickness greater than about 1 nm, or in the range of about 1 nm to about 100 nm.

In some embodiments, the first process cycle is repeated m number of times and the second process cycle is repeated y number of times, where n and y are independently in a range of from 1 to 20. Without intending to be by bound by theory, it is thought that controlling the ratio of the number of repeats of the first deposition cycle 210 to the number of repeat of the second deposition cycle 220, the conformality and the carbon content can be carefully controlled.

The post-processing operation 230 can be, for example, a process to modify film properties (e.g., annealing) or a further film deposition process (e.g., additional ALD or CVD processes) to grow additional films. In some embodiments, the post-processing operation 230 can be a process that modifies a property of the deposited film. In some embodiments, the post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 200 can be performed at any suitable temperature depending on, for example, the first silicon precursor, the second silicon precursor, the oxidizing agent or thermal budget of the device. In some embodiments, exposures to the first silicon precursor (operation 212), the oxidizing agent (operation 216), and the second silicon precursor (operation 222), occur at the same temperature. In some embodiments, the substrate is maintained at a temperature in a range of about 200° C. to about 650° C., or in the range of about 350° C. to about 500° C.

In some embodiments, exposure to the first silicon precursor (operation 212) occurs at a different temperature than the exposure to the oxidizing agent (operation 216). In some embodiments, the substrate is maintained at a first temperature in a range of about 300° C. to about 650° C. for the exposure to the first silicon precursor, and at a second temperature in the range of about 200° C. to about 650° C. for exposure the oxidizing agent. In some embodiments, the substrate may be maintained at a third temperature in a range of about 250° C. to 500° C. for exposure to the second silicon precursor.

In the embodiment illustrated in FIG. 2, first deposition cycle 210 the substrate (or substrate surface) is exposed to the first silicon precursor and the oxidizing agent sequentially. In another, un-illustrated, embodiment, the substrate (or substrate surface) is exposed to the first silicon precursor and the oxidizing agent simultaneously in a CVD reaction.

In one or more embodiments, the silicon oxycarbide (SiOC) nanolaminate film has a carbon content of greater than or equal to about 5%, 7.5%, 10%, 12.5 or 15%, on an atomic basis. In some embodiments, the silicon oxycarbide (SiOC) nanolaminate film comprises a carbon content in the range of about 2% to about 50%, or in the range of about 3% to about 45%, or in the range of about 4% to about 40%, on an atomic basis. In some embodiments, the silicon oxycarbide (SiOC) nanolaminate film has no nitrogen present.

In one or more embodiments, the silicon oxycarbonitride (SiOCN) nanolaminate film has a nitrogen content of greater than or equal to about 0%, 5%, 7.5%, 10%, 12.5, or 15%, on an atomic basis. In some embodiments, the silicon oxycarbonitride (SiOCN) nanolaminate film comprises a nitrogen content in the range of about 0% to about 40%, or in the range of about 3% to about 35%, or in the range of about 4% to about 30%, on an atomic basis.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reducing agent). According to one or more embodiments, a purge gas is injected at the exit of the deposition chamber to prevent reactants (e.g., reducing agent) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing a substrate in a processing chamber to a silicon precursor to deposit a silicon-containing film on the substrate, the silicon precursor having a structure of general formula (Id), (IX), or (X)

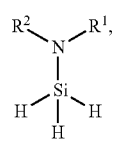

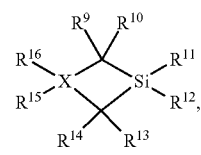

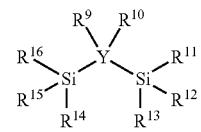

wherein $R^1$, and $R^2$ are independently selected from hydrogen (H), substituted or unsubstituted alkyl, substituted or unsubstituted alkoxy, and substituted or unsubstituted vinyl, X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide;

purging the processing chamber of the silicon precursor;

exposing the substrate to an oxidant to react with the silicon-containing film to form one or more of a silicon oxycarbide (SiOC) film or a silicon oxycarbonitride (SiOCN) film on the substrate, the oxidant comprising one or more of a carboxylic acid, an aldehyde, a ketone, an ethenediol, an oxalic acid, a glyoxylic acid, an alcohol, and a glyoxal; and purging the processing chamber of the oxidant.

2. The method of claim 1, further comprising exposing the substrate to one or more of a strong oxidant or oxygen ($O_2$) plasma, the strong oxidant selected from one or more of ozone ($O_3$) and water ($H_2O$); and purging the processing chamber.

3. The method of claim 2, wherein the plasma is a remote plasma.

4. The method of claim 2, wherein the plasma is a direct plasma.

5. The method of claim 1, wherein the oxidant comprises a structure of Formula (II), Formula (III), Formula (IV), Formula (V), Formula (VI), Formula (VII), and Formula (VIII)

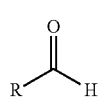

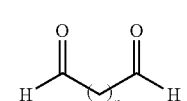

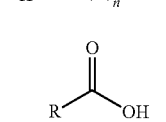

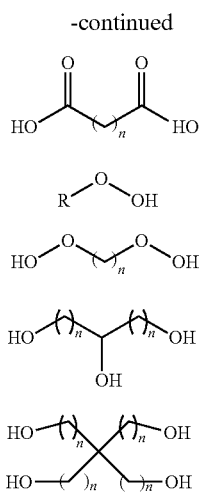

wherein R is selected from the group consisting of $C_1$-$C_6$ alkyl, $C_1$-$C_6$ alkene, $C_1$-$C_6$ alkyne, $C_5$-$C_8$ aryl, and n is an integer from −1 to 6.

6. The method of claim 1, wherein the silicon precursor comprises one or more of silicon precursor comprises one or more of 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, and 1,3-disilacyclobutane.

7. The method of claim 1, wherein the silicon oxycarbide (SiOC) film or the silicon oxycarbonitride (SiOCN) film has a κ-value in a range of about 2.0 to about 6.0.

8. The method of claim 1, wherein purging the processing chamber comprises flowing a purge gas over the substrate.

9. The method of claim 8, wherein the purge gas is selected from one or more of argon (Ar), nitrogen ($N_2$), or helium (He).

10. The method of claim 1, wherein the silicon oxycarbide (SiOC) film or the silicon oxycarbonitride (SiOCN) film has a thickness greater than about 0.1 nm.

11. A method of depositing a film, the method comprising:
exposing a substrate to a silicon precursor of general formulae (Id), (IX), or (X)

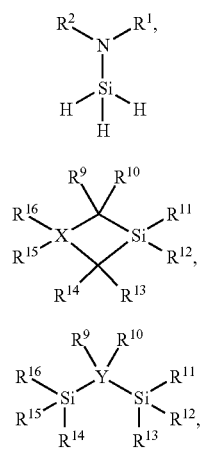

wherein $R^1$ and $R^2$ are independently selected from hydrogen (H), substituted or unsubstituted alkyl, substituted or unsubstituted alkoxy, and substituted or unsubstituted vinyl, X is silicon (Si) or carbon (C), Y is carbon (C) or oxygen (O), $R^9$, $R^{10}$, $R^{11}$, $R^{12}$ $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide to form a silicon-containing film;

exposing the substrate to an oxidant to react with the silicon-containing film to form one or more of a silicon oxycarbide (SiOC) film or a silicon oxycarbonitride (SiOCN) film on the substrate, the oxidant comprising one or more of a carboxylic acid, an aldehyde, a ketone, an ethenediol, an oxalic acid, a glyoxylic acid, an alcohol, and a glyoxal; and exposing the substrate to one or more of a strong oxidant or oxygen ($O_2$) plasma, the strong oxidant selected from one or more of ozone ($O_3$) and water ($H_2O$).

12. The method of claim 11, wherein the oxidant comprises a structure of Formula (II), Formula (III), Formula (IV), Formula (V), Formula (VI), Formula (VII), and Formula (VIII)

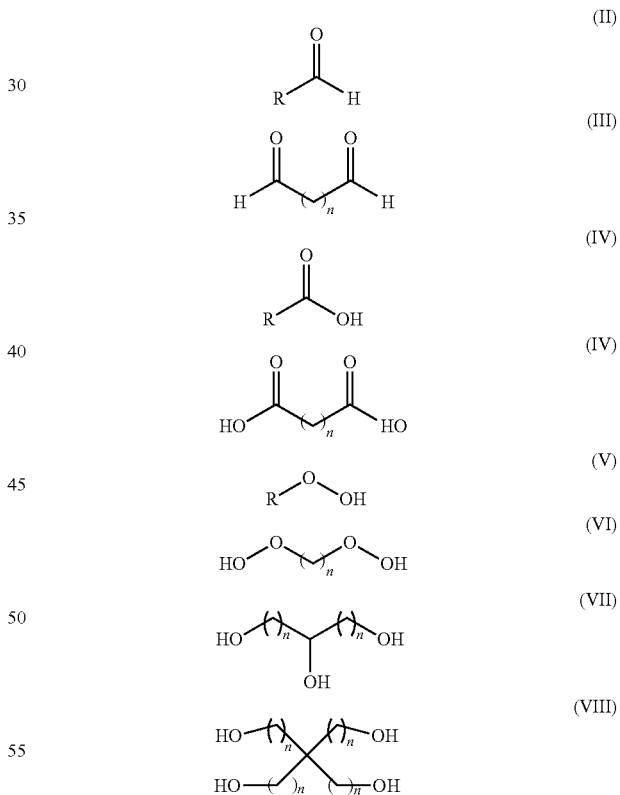

wherein R is selected from the group consisting of $C_1$-$C_6$ alkyl, $C_1$-$C_6$ alkene, $C_1$-$C_6$ alkyne, $C_5$-$C_8$ aryl, and n is an integer from −1 to 6.

13. The method of claim 11, wherein the silicon precursor comprises one or more of silicon precursor comprises one or more of 1,1-Bis(dimethylamino)-3,3-bis(dimethylamino)siletane, 1,3-Bis(dimethylamino)-1,3-divinyl-1,3-disiletane, 1,3-Bis(dimethylamino)-1,3-dimethyl-1,3-disiletane, 1,1,3,3-Tetrakis(dimethylamino)-1,3-disiletane, 1,3-Bis(dimethylamino)-1,3-divinyl-1,3-disiletane, Bis(tris-dimethylamino)silyl methane, and 1,3-disilacyclobutane.

14. A method of forming a nanolaminate, the method comprising:
a first deposition cycle comprising:
exposing a substrate to a first silicon precursor of general formula (Id):

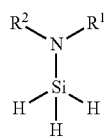
(Id)

wherein $R^1$ and $R^2$ are independently selected from hydrogen (H), substituted or unsubstituted alkyl, substituted or unsubstituted alkoxy, and substituted or unsubstituted vinyl to form a silicon-containing film, and
exposing the substrate to an oxidant to react with the silicon-containing film to form one or more of a silicon oxycarbide (SiOC) film or a silicon oxycarbonitride (SiOCN) film on the substrate, the oxidant comprising one or more of a carboxylic acid, an aldehyde, a ketone, an ethenediol, an oxalic acid, a glyoxylic acid, an alcohol, and a glyoxal; and
a second deposition cycle comprising:
exposing the substrate with one or more of the silicon oxycarbide (SiOC) film or the silicon oxycarbonitride (SiOCN) film thereon to a second silicon precursor having general formula (IXI) or general formula (X)

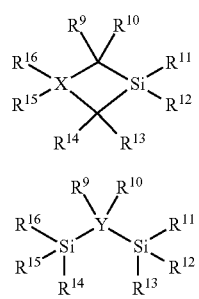

wherein X is silicon (Si) or carbon (C), Y is carbon (C) or oxygen (O), $R^9$, $R^{10}$, $R^{11}$, $R^{12}$, $R^{13}$, $R^{14}$, $R^{15}$, and $R^{16}$ are independently selected from hydrogen (H), substituted or unsubstituted alkyl, substituted or unsubstituted alkoxy, substituted or unsubstituted vinyl, silane, substituted or unsubstituted amine, or halide to deposit a second silicon-containing film on the substrate, and
exposing the substrate to a plasma to react with the second silicon-containing film to form one or more of a silicon oxycarbide (SiOC) nanolaminate or a silicon oxycarbonitride (SiOCN) nanolaminate on the substrate.

15. The method of claim 14, wherein the oxidant comprises a structure of Formula (II), Formula (III), Formula (IV), Formula (V), Formula (VI), Formula (VII), and Formula (VIII)

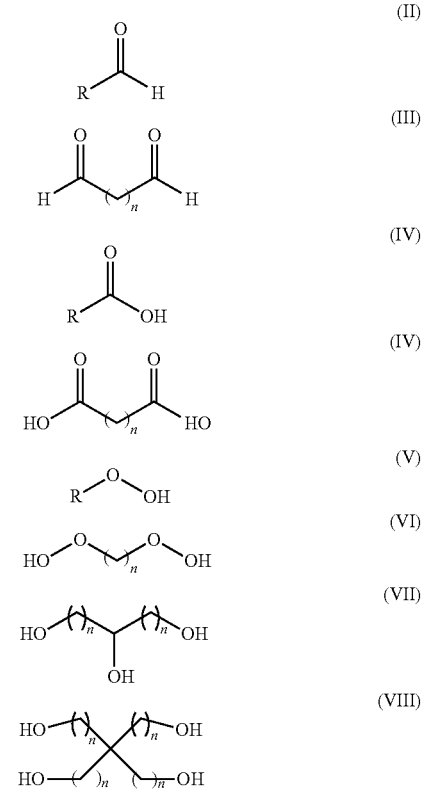

wherein R is selected from the group consisting of $C_1$-$C_6$ alkyl, $C_1$-$C_6$ alkene, $C_1$-$C_6$ alkyne, $C_5$-$C_8$ aryl, and n is an integer from −1 to 6.

16. The method of claim 14, wherein the silicon oxycarbide (SiOC) nanolaminate or the silicon oxycarbonitride (SiOCN) film has a κ-value in a range of about 2.0 to about 6.0.

17. The method of claim 14, wherein the first deposition cycle further comprises exposing the substrate to one or more of a strong oxidant or oxygen ($O_2$) plasma, the strong oxidant selected from one or more of ozone ($O_3$) or water ($H_2O$).

18. The method of claim 14, wherein the plasma comprises one or more of nitrogen ($N_2$), argon (Ar), helium (He), hydrogen ($H_2$), carbon monoxide (CO), or carbon dioxide ($CO_2$).

19. The method of claim 14, further comprising repeating one or more of the first deposition cycle or the second deposition cycle to form one or more of the silicon oxycarbide (SiOC) nanolaminate or the silicon oxycarbonitride (SiOCN) nanolaminate having a thickness of about 0.5 to about 100 nm.

20. The method of claim 19, wherein the first deposition cycle is repeated m number of times and the second deposition cycle is repeated y number of times, where n and y are independently in a range of from 1 to 20.

* * * * *